United States Patent [19]

Farazi et al.

[11] 4,320,506
[45] Mar. 16, 1982

[54] APPARATUS AND METHOD FOR SIMULATION TESTING OF AN ANTI-BLOCK SYSTEM

[75] Inventors: Perry Farazi, Chicago; Howard L. Frank, Skokie, both of Ill.

[73] Assignee: Sun Electric Corporation, Crystal Lake, Ill.

[21] Appl. No.: 177,079

[22] Filed: Aug. 11, 1980

Related U.S. Application Data

[63] Continuation of Ser. No. 23,463, Mar. 23, 1979, abandoned.

[51] Int. Cl.³ ............................................. G01R 31/28
[52] U.S. Cl. ..................................... 371/20; 303/92; 364/426
[58] Field of Search ............... 364/426, 578, 579, 580; 371/20; 303/92; 340/52 B; 324/73 R

[56] References Cited

U.S. PATENT DOCUMENTS

| | | | |
|---|---|---|---|
| 3,764,995 | 10/1973 | Helf, Jr. et al. | 364/579 |
| 3,852,613 | 12/1974 | Wienecke | 303/92 |
| 3,866,980 | 2/1975 | Eisele et al. | 303/92 |
| 3,907,380 | 9/1975 | Fleischer et al. | 303/92 |
| 4,041,283 | 8/1977 | Mosier | 364/426 |
| 4,106,820 | 8/1978 | Ruynau et al. | 303/92 |
| 4,106,821 | 8/1978 | Brearley | 303/92 |
| 4,116,494 | 9/1978 | Gudat | 303/92 |
| 4,192,180 | 3/1980 | Gerstenmeier et al. | 303/92 |
| 4,252,014 | 2/1981 | Ruof | 303/92 |

Primary Examiner—Charles E. Atkinson
Attorney, Agent, or Firm—Allegretti, Newitt, Witcoff & McAndrews

[57] ABSTRACT

An apparatus and method for simulation testing of an anti-block system, as utilized in automobiles.

13 Claims, 2 Drawing Figures

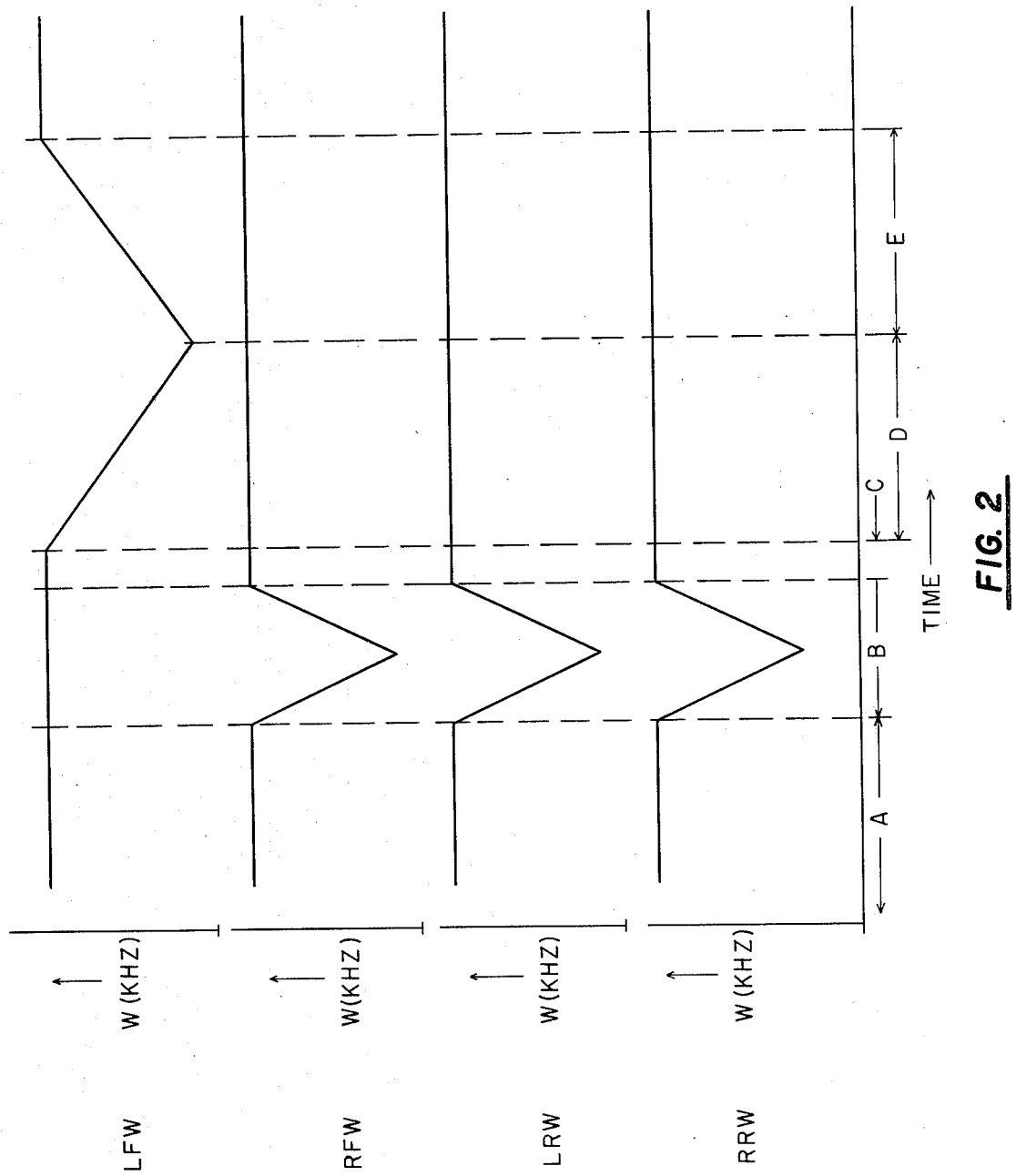

APPARATUS AND METHOD FOR SIMULATION TESTING OF AN ANTI-BLOCK SYSTEM

This is a continuation of application Ser. No. 023,463, filed Mar. 23, 1979 and now abandoned.

BACKGROUND OF THE INVENTION

This invention relates to simulation testing of an anti-block system and more particularly to an apparatus and a method for simulation testing of an anti-block system as utilized in an automobile.

Automobiles are currently being produced with anti-block or anti-skid systems to control skidding. Such an anti-block system typically includes a rotary movement-electrical signal transducer subsystem associated with each wheel of the automobile, a computer controller, and an electrical signal-brake pressure transducer subsystem associated with each brake of the automobile. Each rotary movement-electrical signal transducer subsystem supplies an electrical signal which is in pulses frequency-related to the rotary movement of its associated wheel. These signals are read and interpreted by a processor-controller, which, when a skid is indicated signals the electrical signal-brake pressure transducer subsystems to appropriately adjust brake pressure and thereby block or reduce braking of the skidding wheels.

In at least one such system, as manufactured and sold by Robert Bosch GmbH, the processor-controller generates a pressure release signal when the frequency of the input signal from a wheel drops below and is decreasing from the frequency of the input signal from the other wheels. The computer controller also generates a pressure hold signal when the frequency is low but increasing. With a rear wheel, the pressure release and pressure hold signals are of relative long duration. With the front wheels, however, these signals are so brief as to be make accurate measurement of their magnitude practically impossible.

In the past, testing of the Bosch controller has been conducted by electronically simulating simultaneous skidding of all four automobile wheels. Since simulation of this situation may not accurately reveal front-wheel responsiveness, a better test has long been sought.

SUMMARY OF THE INVENTION

In a principal aspect, the present invention is a method of testing the processor-controller of an automobile anti-block system. First, a substantially fixed frequency signal is supplied to the inputs of said processor controller. The substantially fixed frequency signal is then maintained to a selected input and a decreased frequency signal is simultaneously applied to the remainder of inputs. The processor-controller is thereby forced to temporarily adopt the substantially fixed frequency signal at the selected input as a reference signal and thereby become responsive to the selected input so as to output a steady pressure release signal when the frequency of the signal to the selected input is below the substantially fixed frequency signal and dropping, and so as to output a steady pressure hold signal when the frequency of the signal to the selected input is below the substantially fixed frequency signal and rising.

A signal is then supplied to the selected input having a frequency gradually dropping from the substantially fixed frequency signal while the processor-controller has temporarily adopted the fixed frequency signal. The amplitude of the pressure release signal is simultaneously measured.

A signal is thereafter supplied to the selected input having a frequency gradually rising to the fixed frequency, also while the processor-controller has temporarily adopted the fixed frequency signal. The amplitude of the pressure hold signal is simultaneously measured.

As a result of this procedure, the responsiveness of the processor-controller can be accurately tested, regardless of whether the pressure release and pressure hold signals are normally too brief.

In another principal aspect, the present invention is an apparatus for accomplishing the above method.

It is thus a principal object of the present invention to provide an apparatus and a method of testing the processor-controller of an automobile anti-block system.

Another object of the present invention is to provide an apparatus and a method of testing particularly suited to testing the front-wheel responsiveness of a processor-controller such as manufactured and sold by Robert Bosch GmbH.

Another object of the present invention is to provide an apparatus and a method of remote, electronic testing that is rapid, highly accurate and economical.

BRIEF DESCRIPTION OF THE DRAWING

FIG. 2 of the accompanying drawing is a graph of the preferred method and operation of the preferred apparatus of the present invention.

DETAILED DESCRIPTION OF THE PREFERRED EMBODIMENT

Figure 1:
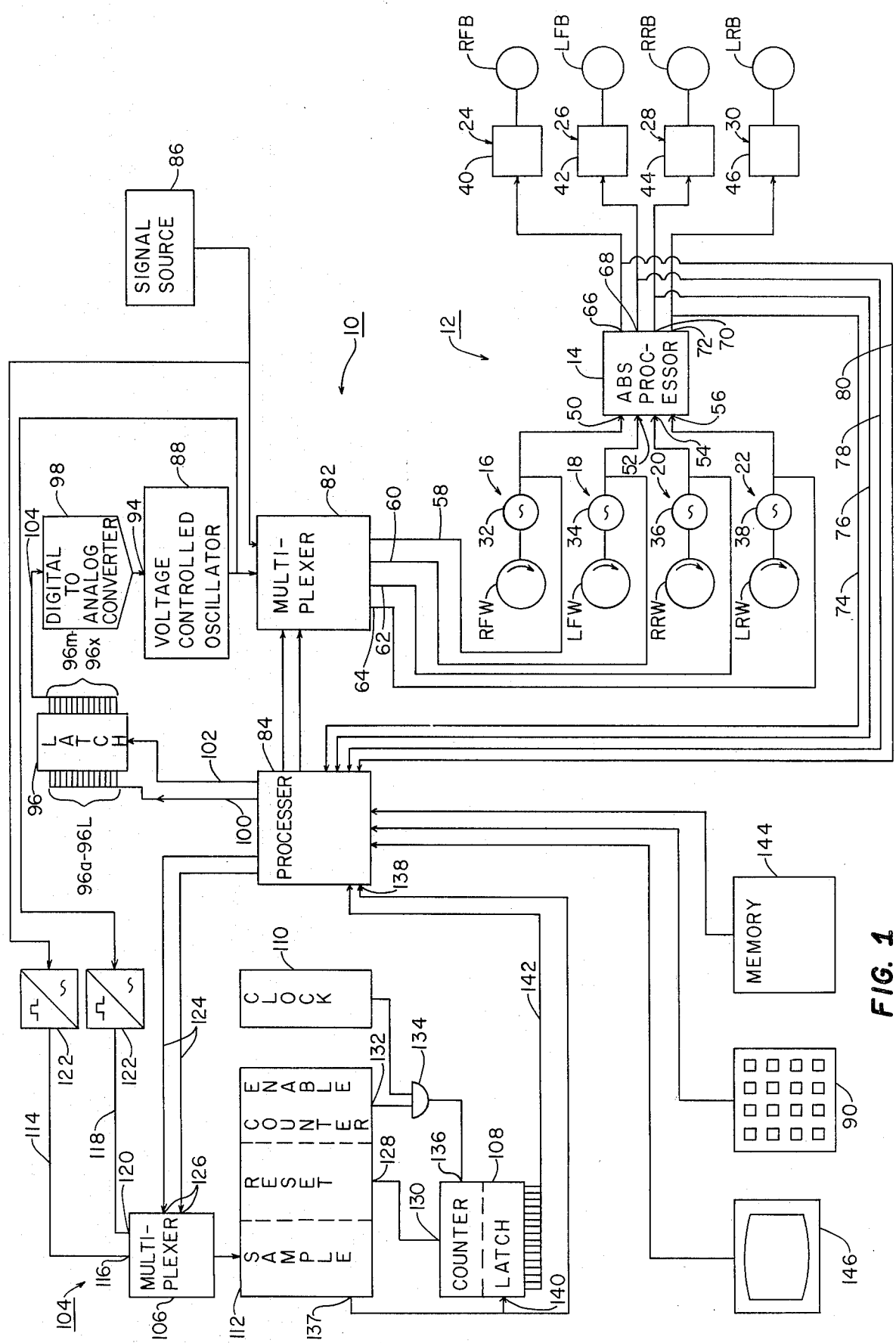
FIG. 1 of the accompanying drawing is a schematic diagram of the preferred apparatus of the present invention.

Referring to FIG. 1, the preferred embodiment of the present invention is an apparatus generally designated 10 for simulation testing of an automobile anti-block system (ABS) generally designated 12. p For the purpose of illustration, the ABS 12 includes an ABS processor 14, four rotary movement-electrical signal transducers (RM-ES transducers) 16, 18, 20, 22 and four electrical signal-hydraulic brake pressure transducers (ES-HBP transducers) 24, 26, 28, 30. Each RM-ES transducer 16, 18, 20, 22 is responsive to rotary movement of an automobile wheel so as to generate an electrical signal in response thereto, and each ES-HBP transducer 24, 26, 28, 30 is responsive to an electrical signal so as to generate a hydraulic pressure change to an automobile brake. The ABS processor 14 receives and processes the electrical signals from the RM-ES transducers 16, 18, 20 22 and signals the ES-HBP transducers 24, 26, 28, 30 as appropriate.

More particularly, the RM-ES transducer 16 is responsive to the right front automobile wheel RFW; the RM-ES transducer 18 is responsive to the left front wheel LFW; the RM-ES transducer 20 is responsive to the right rear wheel RRW; and the RM-ES transducer 22 is responsive to the left rear wheel LRW. The RM-ES transducers include tachometer-generators 32, 34, 36, 38, respectively. Each tachometer-generator 32, 34, 36 38 senses rotation of its associated automobile wheel RFW, LFW, RRW, LRW, respectively, and generates a sinusoidal signal in response thereto. The frequency of the sinusoidal signal is proportional to the frequency of wheel rotation.

The ES-HBP transducer 24 controls the right front brake RFB; the ES-HBP transducer 26 controls the left front brake LFB; the ES-HBP transducer 28 controls the right rear brake RRB; and the ES-HBP transducer 30 controls the left rear brake LRB. The ES-HBP transducers 24, 26, 28, 30 include brake control valves 40, 42, 44, 46, respectively. Each brake control valve 40, 42, 44, 46 responds to three different voltage-level inputs and has three corresponding valve settings. An input of a first or "pressure uninhibited" voltage level places the control valves 40, 42, 44, 46 in a "brake uninhibited" state. Control valves 40, 42, 44, 46 are biased to this state, which permits uninhibited application of the brakes by the automobile operator, i.e., the driver. An input of a second or "pressure release" voltage level places the control valves 40, 42, 44, 46 in a "pressure release" state. In this state, the operator's application of the brakes is overridden, and no application of the brakes is permitted. An input of a third or "pressure hold" voltage level places the control valves 40, 42, 44, 46 in a "pressure hold" state, which overrides the operator's ability to control braking by maintaining the braking pressure existing when the "hold" state takes effect.

The ABS processor 14 receives the sinusoidal signals from the RM-ES transducers 16, 18, 20, 22 and compares them. If the signals received from one or more of the RM-ES transducers 16, 18, 20, 22 is lower in frequency than the signals received from the remainder of the RM-ES transducers 16, 18, 20, 22, the ABS processor 14 generates a signal to the particular ES-HBP transducers among ES-HBP transducers 24, 26, 28, 30 which control the brakes of the wheels from which the lower frequency signals are received. If the RM-ES transducer signal is decreasing in frequency, the ABS processor 14 supplies a pressure release signal; if the RM-ES transducer signal is increasing, the ABS processor 14 supplies a pressure hold signal.

As an example, if the left front wheel LFW skids while the driver is braking, the rotational frequency of the left front wheel LFW decreases as compared to the other wheels RFW, LRW, RRW. The signal frequency of the RM-ES transducer 18 decreases proportionally, and this decrease is received by the ABS processor 14. The ABS processor 14 responsively transmits a pressure release input to the ES-HBP transducer 26, which releases pressure to the left front brake LFB, thereby permitting the left front wheel LFW to increase its rotational velocity. The increasing rotational velocity is then sensed by the RM-ES transducer 18 and the ABS processor 14 responsively transmits a pressure hold input to the ES-HBP transducer 26 which partially brakes the left front brake LFB.

With an ABS processor 14 such as Robert Bosch GmbH No. B 265 100 003, the pressure release and pressure hold signals from the ABS processor are stable for the rear brake transducers 28 and 30, and extremely brief for the front brake transducers 24, 26. The difference apparently relates to steering or automobile responsiveness to front wheel versus rear wheel skids.

As stated, the apparatus 10 is for simulation testing of the ABS processor 14. The apparatus 10 supplies simulated RM-ES transducer signals to the inputs of the ABS processor 14 and monitors the ABS processor outputs. The simulated RM-ES transducer signals are supplied to the inputs 50, 52, 54, 56 of the ABS processor 14 via cables 58, 60, 62, 64 of the apparatus 10, respectively. The processor outputs 66 68, 70, 72 are monitored via cables 74, 76, 78, 80 of the apparatus 10, respectively. As a first step in testing the ABS processor 14, a test operator connects the cables 58, 60, 62, 64, 74, 76, 78, 80 to their appropriate inputs and outputs. As most preferred, the cables 58, 60, 62, 64, 74, 76, 78, 80 are bundled and the connection made with a conventional multiple plug-socket connector. The cables 58, 60, 62, 64 are connected to the outputs of a multiplexer 82, which is controlled by a processor 84. The multiplexer 82 receives signals from a signal source 86 and a voltage controlled oscillator 88. The processor 84, in response to instructions from an operator control panel 90, such as a keyboard, commands the multiplexer 82 to direct the signal of the source 86 to one or more of the cables 58, 60, 62, 64 and to direct the signal of the oscillator 88 to the remaining cables.

The source 86 generates a substantially uniform sinusoidal signal. As most preferred, the frequency of the source 86 is 2500 Hertz.

The oscillator 88 also generates a sinusoidal signal. The frequency of the oscillator 88 is variable, in proportion to a control signal received at the oscillator input 94. As most preferred, the oscillator 88 generates signals within a range of frequencies including 2500 Hertz and 1000 Hertz.

The oscillator 88 is controlled by the processor 84 through a 12-bit latch 96 and a digital-to-analog converter 98. The processor 84 generates oscillator control data, which it transmits to the latch inputs 96a–l through data bus 100. The processor enables the latch 96 via a latch enable input 102. A command from the processor 84 thus sets the latch 96 according to the data at its inputs 96a–l.

The digital-to-analog converter 98 is connected to the latch outputs 96m–x via data bus 104 and converts the digital data of the latch 96 to an analog signal. This analog signal is transmitted to the input 94 of the oscillator 88.

The signals from the signal source 86 and the oscillator 88 are monitored by the processor 84 through a feed-back circuit generally designated 104. The circuit 104 includes a multiplexer 106, a counter-latch 108, a clock 110 and a counter enable-counter reset-counter sample controller 112. A first input lead 114, which is connected to a first input 116 of the multiplexer 106 and between the source 86 and the multiplexer 82 transmits the signal of the signal source 86 to the multiplexer 106. A second input lead 118, which is to a second input 120 of the multiplexer 106 and connected between the oscillator 88 and the multiplexer 82 transmits the signal of the oscillator 88 to the multiplexer 106.

Wave-shaping stages 122 along input leads 114, 118 shape the sinusoidal signals of the source 86 and oscillator 88 into square waves of equivalent periods. The multiplexer 106 thus receives square-wave inputs. The wave-shaping stages 122 are conventional, and shape by zero-crossing detection or the like.

Control leads 124 connect the processor 84 and the multiplexer control inputs 126.

The output of the multiplexer 106 is transmitted to the input of the controller 112. The controller 112 is responsive to the rising (or falling) flanks of pulses from the multiplexer 106, and particularly responsive to the rising (or falling) flank of the first pulse after an extended delay between pulses.

The controller 112 responds particularly to a first pulse by transmitting a "reset" output signal via an output 18 to a counter reset input 130 of the counter-latch 108, and by transmitting an "enable" output signal via an output 132 to a gate 134. The gate 134 inter-connects the clock 110 and a counter input 136 of the counter-latch 108. When the output signal from output 132 is received, the gate 134 connects the clock 110 to the counter input 136. The counter-latch 108 thus counts 5 pulses from the clock 110, beginning from zero.

The controller 112 responds to the rising flank of the first and to each succeeding pulse by transmitting a "sample" signal via output 137 to a processor input 138 of the processor 84 and a latch-set input 140 of the counter-latch 108. The signal at latch-set 140 sets the latch of counter-latch 108 at the current count. The signal at the processor input 138 activates the processor 84 to read the latch of counter-latch 108 via data bus 142. The processor 84 stores the latch data or count in a memory 144.

The feed-back circuit 104 and processor 84 thus cooperate to measure and store raw data as to the time periods of pulses from the source 86 and the oscillator 88. The processor 84 compares pairs of succeeding counts and calculates the difference in counts to establish the time periods of pulses in units of clock pulses.

The frequency of the clock 110 is stored in memory 144. As most preferred, the frequency of the clock is 20 MHz. The processor 84 converts the time periods of pulses as measured in units of clock pulses to units of seconds, or any other desired unit of time.

The processor 84 compares the time periods of the pulses as calculated to stored data indicating desired time periods. The processor 84 adjusts the data transmitted to the latch 96 according to the difference between the measured time periods and the desired time periods.

The apparatus 10 is thus capable of precisely simulating various skidding conditions to test the ABS processor 14. The apparatus 10 simulation tests the ABS processor 14 as follows.

After connecting the cables 58, 60, 62, 64, 66, 68, 70, 72, the test operator informs the apparatus 10 via operator control 90 to initiate testing. The apparatus 10 then proceeds to test the responsiveness of the ABS processor 14 to successive simulated skids of the automobile wheels LFW, RFW, LRW, RRW. Skids of each of the four wheels LFW, RFW, LRW, RRW are identically simulated; therefore, only the simulation of the skid of the left front wheel LFW is described.

Beginning this simulation, the processor 84 signals the multiplexer 82 to output the signal of the signal source 86 to all four cables 58, 60, 62, 64, as shown in interval A of FIG. 2. The ABS processor 14 is thus initialized; the ABS processor 14 interprets the matched frequency signals as non-skidding movement of the wheels RFW, LFW, RRW, LRW and becomes ready to respond to skids. At this time, the processor 84 also commands the multiplexer 106 to output the signal of the signal source 86. The processor 84 tests the time periods of pulses of the signal source 86 as counted by the counter-latch 108, and utilizes the resulting information to select initial data for the latch 96.

The processor 84 then commands the multiplexer 82 to output the signal of the signal source 86 to the cable 60 and to output the signal of the oscillator 88 to the remaining cables 58, 62, 64. Substantially simultaneously, the processor 84 transmits the selected data to the latch 96. The processor 84 also enables the latch 96, thereby initializing the oscillator 88. The initial data transmitted to the latch 96 sets the oscillator frequency at the signal source frequency.

The processor then commands the multiplexer 106 to output the signal of the oscillator 88, and thereafter adjusts the data transmitted to the latch 96 according to the actual output of the oscillator 88.

The data processor 84 maintains the command to the multiplexer 82 and simultaneously, repeatedly revises the data transmitted to the latch 96, enabling the latch 96 as new data is transmitted. The revised data lowers the frequency of the oscillator 88 and supplies a decreasing ramp signal to the cables 58, 62, 64, as shown by interval B of FIG. 2.

Maintaining the command to the multiplexer 82, the processor 84 transmits an increasing ramp signal to the cables 58, 62, 64, as soon as a pulse time period of preselected duration is measured from the data of counter-latch 108. This interval of operation is diagrammed in FIG. 2 as interval B. As most preferred, the pre-selected time period corresponds to a one-thousand Hertz signal of the oscillator 88. Also as most preferred, the frequency decreasing and frequency increasing intervals of interval B are approximately equal and persist a total of about one second.

The fall of frequencies at the cables 58, 62, 64 during interval B is interpreted by the ABS processor 14 as a skid of the three wheels RFW, RRW, LRW. The ABS processor 14 is thus forced to temporarily adopt as its reference signal the substantially fixed frequency signal transmitted by the cable 60 to the input 52. By this forcing, the apparatus 10 forces the ABS processor 14 to become responsive to its input 52 so as to output steady pressure release and pressure hold signals regardless of whether it was programmed to output such steady signals or to output only brief signals. This condition persists a brief period after the signals to inputs 50, 54, 56 match the signal to input 52, as represented by interval C of FIG. 2. In the Robert Bosch processor-controller No. B 265 100 003, the condition lasts about one quarter second.

Within the time interval C, the processor 84 transmits a new command to the multiplexer 82. This command directs the multiplexer 82 to output the signal of the signal source 86 to the three cables 58, 62, 64 and to output the signal of the oscillator 88 to the cable 60. Substantially simultaneously, the processor 84 begins the transmission of data signals and enable signals to the latch 96, so as to supply a decreasing ramp signal to the cable 60. The ramp signal is maintained over a time interval D and is followed with an increasing ramp signal during a time interval E.

Having been forced to adopt the signal at input 60 as a reference, the ABS processor 14 responds to the decreasing ramp signal with a steady pressure release signal and to the increasing ramp signal with a steady pressure hold signal. During the expected duration of these signals, the processor 84 measures the amplitude of the signals and displays them on the video display 146. The operator can thus view the signal strengths and take action as deemed necessary.

With an apparatus 10 as most preferred, the time intervals D and E together total about three seconds, and the low frequency supplied to the cable 60 is 1000 Hertz. Also as most preferred, the intervals D and E immediately precede and follow each other. Some delay less than a quarter second is tolerable, but longer delay permits the ABS processor 14 to release the signal at input 60 and revert to non-steady pressure release and pressure hold signals.

What is claimed is:

1. An apparatus for testing an anti-block system of the type including an ABS processor, said ABS processor having at least a first and second input and providing a brake control signal, comprising, in combination:

first signal means for providing a substantially constant frequency signal;

second signal means for receiving a frequency control signal and for responsively providing a variable frequency signal;

third signal means for controllably providing said frequency control signal;

multiplexer means for controllably and selectively interconnecting said first and second inputs of said ABS processor to said first signal means and said second signal means;

display means for displaying an output signal representative of said brake control signal of said ABS processor; and processor means for controlling said third signal means and said multiplexer means in accordance with a predetermined sequence, for receiving said brake control signal from said ABS processor, and for responsively providing said output signal to said display means, whereby said first and second inputs of said ABS processor receive said substantially constant frequency signal and said variable frequency signal in accordance with said predetermined sequence, said ABS processor responsively provides said brake control signal, and said output signal, representative of said brake control signal, is displayed for analysis thereof.

2. An apparatus as claimed in claim 1 wherein said second signal means includes a voltage controlled oscillator coupled to said multiplexer means.

3. An apparatus as claimed in claim 2 wherein said third signal means includes a latch coupled to said processor means and a digital-to-analog converter interposed said latch and said voltage controlled oscillator.

4. An apparatus as claimed in claim 3 wherein said processor means further provides a variable latch voltage to said latch, whereby the frequency of said variable frequency signal is controlled in accordance with said predetermined sequence.

5. An apparatus as claimed in claim 1 wherein said processor means, in accordance with said predetermined sequence, causes said multiplexer means to interconnect said first signal means and said second signal means to said first input and said second input of said ABS processor, respectively, for a first predetermined time period, said first predetermined time period having a first portion and a second portion.

6. An apparatus as claimed in claim 5 wherein said processor means, in accordance with said predetermined sequence, controls said third signal means such that the frequency of said substantially constant frequency signal and said variable frequency signal are equivalent during said first portion of said first predetermined time period.

7. An apparatus as claimed in claim 6 wherein said processor means, in accordance with said predetermined sequence, controls said third signal means such that the frequency of said variable frequency signal initially decreases and then increases during said second portion of said first predetermined time period.

8. An apparatus as claimed in claim 5 wherein said processor means, in accordance with said predetermined sequence, causes said multiplexer means to interconnect said first signal means and said second signal means to said second input and said first input of said ABS processor, respectively, for a second predetermined time period following said first predetermined time period.

9. An apparatus as claimed in claim 8 wherein said processor means, in accordance with said predetermined sequence, controls said third signal means such that the frequency of said variable frequency signal initially decreases and then increases during said second predetermined time period.

10. An apparatus as claimed in claim 1 further comprising feedback means for controllably monitoring said substantially constant frequency signal and said variable frequency signal and for providing a timing signal to said processor means, said timing signal representing the frequency of said substantially constant frequency signal and said variable frequency signal.

11. An apparatus as claimed in claim 10 wherein said processor means controls said third signal means in response to said timing signal.

12. A method for testing an ABS processor of the type incorporated into an anti-block system, said ABS processor having at least a first and second input and providing a brake control signal, comprising the steps of:

inputting a substantially constant frequency signal to said first input of said ABS processor for a predetermined time period, said predetermined time period having a first and second portion;

inputting a variable frequency signal to said second input of said ABS processor for said first predetermined time period;

matching the frequency of said substantially constant frequency signal and said variably frequency signal during said first portion of said first predetermined time period;

decreasing and then increasing the frequency of said variable frequency signal during said second portion of said first predetermined time period; and monitoring said brake control signal provided by said ABS processor during at least said first portion of said first predetermined time period.

13. A method as claimed in claim 12 further comprising the steps of:

inputting said substantially constant frequency signal and said variable frequency signal to said second input and said first input of said ABS processor, respectively, for a second predetermined time period after said first predetermined time period;

matching the frequency of said substantially constant frequency signal and said variable frequency signal;

decreasing and then increasing the frequency of said variable frequency signal during said second predetermined time period; and monitoring said brake control signal provided by said ABS processor.

* * * * *